United States Patent
Momtaz et al.

(10) Patent No.: US 7,132,727 B2
(45) Date of Patent: Nov. 7, 2006

(54) LAYOUT TECHNIQUE FOR C3MOS INDUCTIVE BROADBANDING

(75) Inventors: Afshin D. Momtaz, Irvine, CA (US); Michael M. Green, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 10/847,832

(22) Filed: May 18, 2004

(65) Prior Publication Data

US 2004/0207040 A1 Oct. 21, 2004

Related U.S. Application Data

(63) Continuation of application No. 09/861,143, filed on May 17, 2001, now Pat. No. 6,864,558.

(51) Int. Cl.
*H01L 29/00* (2006.01)

(52) U.S. Cl. .................. 257/528; 257/531; 257/536
(58) Field of Classification Search .......... 257/528–536
See application file for complete search history.

(56) References Cited

U.S. PATENT DOCUMENTS

| | | | |
|---|---|---|---|
| 4,449,248 A | 5/1984 | Leslie et al. |
| 4,519,068 A | 5/1985 | Krebs et al. |
| 4,545,023 A | 10/1985 | Mizzi |
| 4,680,787 A | 7/1987 | Marry |
| 4,731,796 A | 3/1988 | Masterton et al. |
| 4,737,975 A | 4/1988 | Shafer |
| 4,761,822 A | 8/1988 | Maile |
| 4,777,657 A | 10/1988 | Gillaspie |
| 4,794,649 A | 12/1988 | Fujiwara |
| 4,804,954 A | 2/1989 | Macnak et al. |
| 4,807,282 A | 2/1989 | Kazan et al. |
| 4,817,115 A | 3/1989 | Campo et al. |
| 4,850,009 A | 7/1989 | Zook et al. |
| 4,890,832 A | 1/1990 | Komaki |
| 4,894,792 A | 1/1990 | Mitchell et al. |
| 4,916,441 A | 4/1990 | Gombrich |
| 4,964,121 A | 10/1990 | Moore |
| 4,969,206 A | 11/1990 | Desrochers |
| 4,977,611 A | 12/1990 | Maru |
| 4,995,099 A | 2/1991 | Davis |
| 5,008,879 A | 4/1991 | Fischer et al. |
| 5,025,486 A | 6/1991 | Klughart |
| 5,029,183 A | 7/1991 | Tymes |
| 5,031,231 A | 7/1991 | Miyazaki |
| 5,033,109 A | 7/1991 | Kawano et al. |
| 5,055,659 A | 10/1991 | Hendrick et al. |
| 5,055,660 A | 10/1991 | Bertagna et al. |
| 5,081,402 A | 1/1992 | Koleda |
| 5,087,099 A | 2/1992 | Stolarczyk |

(Continued)

FOREIGN PATENT DOCUMENTS

WO     WO 99/56341 A     11/1999

OTHER PUBLICATIONS

Y. Kawazu et al., "Novel ELFIN (embedded–metal–layer process for fully integrated NOR) cell for 16/64 Mbit flash EEPROM," *Electronics Letters*, Jul. 21, 1994, pp. 1209–1210, vol. 30, No. 15.

(Continued)

*Primary Examiner*—Cuong Nguyen
(74) *Attorney, Agent, or Firm*—Christie, Parker & Hale, LLP

(57) ABSTRACT

An improved cell layout for a C3MOS circuit with inductive broadbanding positions the inductor at a distance from the active region to improve isolation and aligns the edges of the resistor, inductor, and transistor regions near the common edge of adjacent cells to decrease the length of the cell-to-cell interconnect lines.

18 Claims, 3 Drawing Sheets

U.S. PATENT DOCUMENTS

| | | |
|---|---|---|
| 5,117,501 A | 5/1992 | Childress et al. |
| 5,119,502 A | 6/1992 | Kallin et al. |
| 5,121,408 A | 6/1992 | Cai et al. |
| 5,123,029 A | 6/1992 | Bantz et al. |
| 5,128,938 A | 7/1992 | Borras |
| 5,134,347 A | 7/1992 | Koleda |
| 5,142,573 A | 8/1992 | Umezawa |
| 5,150,361 A | 9/1992 | Wieczorek et al. |
| 5,152,006 A | 9/1992 | Klaus |
| 5,153,878 A | 10/1992 | Krebs |
| 5,175,870 A | 12/1992 | Mabey et al. |
| 5,179,721 A | 1/1993 | Comroe et al. |
| 5,181,200 A | 1/1993 | Harrison |
| 5,230,084 A | 7/1993 | Nguyen |
| 5,239,662 A | 8/1993 | Danielson et al. |
| 5,241,542 A | 8/1993 | Natarajan et al. |
| 5,241,691 A | 8/1993 | Owen |
| 5,249,220 A | 9/1993 | Moskowitz et al. |
| 5,249,302 A | 9/1993 | Metroka et al. |
| 5,265,238 A | 11/1993 | Canova, Jr. et al. |
| 5,265,270 A | 11/1993 | Stengel et al. |
| 5,274,666 A | 12/1993 | Dowdell et al. |
| 5,276,680 A | 1/1994 | Messenger |
| 5,278,831 A | 1/1994 | Mabey et al. |
| 5,289,469 A | 2/1994 | Tanaka |
| 5,291,516 A | 3/1994 | Dixon et al. |
| 5,293,639 A | 3/1994 | Wilson et al. |
| 5,296,849 A | 3/1994 | Ide |
| 5,297,144 A | 3/1994 | Gilbert et al. |
| 5,323,392 A | 6/1994 | Ishii et al. |
| 5,331,509 A | 7/1994 | Kikinis |
| 5,345,449 A | 9/1994 | Buckingham et al. |
| 5,349,649 A | 9/1994 | Iijima |
| 5,361,397 A | 11/1994 | Wright |
| 5,363,121 A | 11/1994 | Freund |
| 5,373,149 A | 12/1994 | Rasmussen |
| 5,373,506 A | 12/1994 | Tayloe et al. |
| 5,390,206 A | 2/1995 | Rein et al. |
| 5,392,023 A | 2/1995 | D'Avello et al. |
| 5,406,615 A | 4/1995 | Miller, II et al. |
| 5,406,643 A | 4/1995 | Burke et al. |
| 5,418,837 A | 5/1995 | Johansson et al. |
| 5,420,529 A | 5/1995 | Guay et al. |
| 5,423,002 A | 6/1995 | Hart |
| 5,426,637 A | 6/1995 | Derby et al. |
| 5,428,636 A | 6/1995 | Meier |
| 5,430,845 A | 7/1995 | Rimmer et al. |
| 5,438,329 A | 8/1995 | Gastouniotis et al. |
| 5,440,560 A | 8/1995 | Rypinski |
| 5,465,081 A | 11/1995 | Todd |
| 5,481,265 A | 1/1996 | Russell |
| 5,481,562 A | 1/1996 | Pearson et al. |
| 5,533,029 A | 7/1996 | Gardner |
| 5,535,373 A | 7/1996 | Olnowich |
| 5,544,222 A | 8/1996 | Robinson et al. |
| 5,579,487 A | 11/1996 | Meyerson et al. |
| 5,584,048 A | 12/1996 | Wieczorek |
| 5,628,055 A | 5/1997 | Stein |
| 5,630,061 A | 5/1997 | Richter et al. |
| 5,675,584 A | 10/1997 | Jeong |
| 5,680,633 A | 10/1997 | Koenck et al. |
| 5,724,361 A | 3/1998 | Fiedler |
| 5,732,346 A | 3/1998 | Lazaridis et al. |
| 5,740,366 A | 4/1998 | Mahany et al. |
| 5,744,366 A | 4/1998 | Kricka et al. |
| 5,767,699 A | 6/1998 | Bosnyak et al. |
| 5,796,727 A | 8/1998 | Harrison et al. |
| 5,798,658 A | 8/1998 | Werking |
| 5,839,051 A | 11/1998 | Grimmett et al. |
| 5,940,771 A | 8/1999 | Gollnick et al. |
| 5,966,520 A | 10/1999 | Buer et al. |
| 6,014,705 A | 1/2000 | Koenck et al. |
| 6,038,254 A | 3/2000 | Ferraiolo et al. |
| 6,057,555 A | 5/2000 | Reedy et al. |
| 6,060,951 A | 5/2000 | Inoue et al. |
| 6,061,747 A | 5/2000 | Ducaroir et al. |
| 6,094,074 A | 7/2000 | Chi et al. |
| 6,188,339 B1 | 2/2001 | Hasegawa |
| 6,194,950 B1 | 2/2001 | Kibar et al. |
| 6,194,961 B1 | 2/2001 | Passeraub |
| 6,201,287 B1 * | 3/2001 | Forbes ...................... 257/528 |
| 6,222,380 B1 | 4/2001 | Gerowitz et al. |
| 6,265,898 B1 | 7/2001 | Bellaouar |
| 6,374,311 B1 | 4/2002 | Mahany et al. |
| 6,424,194 B1 | 7/2002 | Hairapetian |
| 6,463,092 B1 | 10/2002 | Kim et al. |
| 6,611,041 B1 * | 8/2003 | Maeda et al. ............... 257/531 |
| 6,841,843 B1 * | 1/2005 | Ohkubo et al. ............ 257/536 |
| 2002/0040985 A1 | 4/2002 | Aldrich |
| 2002/0110989 A1 | 8/2002 | Yamaguchi et al. |
| 2003/0102521 A1 | 6/2003 | Maeda et al. |

OTHER PUBLICATIONS

Wong et al., "A Wide Tuning Range Gated Varactor," *IEEE Journal of Solid–State Circuits*, May 2000, pp. 773–779, vol. 35, No. 5.

Bida, *A Hybrid Wireless MAC Protocol Supporting Asynchronous and Synchronous MSDU Delivery Services*, IEEE 802.11/91–92, Sep. 1991, pp. 1–46.

Robert Meier's Master's Thesis, *Mobile Computer Network Architecture*,, (May 1993), 82 pages.

Hoberecht, *A Layered Network Protocol for Packet Voice and Data Integration*, IEEE Journal on Selected Areas in Communications, vol. SAC–1, No. 6 (Dec. 1983), pp. 1006–1013.

Rypinski, *Architecture–Topology and Protocol Stacks*, IEEE 802.11/91–21, Mar. 1991, 12 pages.

Cheah, *A Proposed Architecture and Access Protocol Outline for the IEEE 802.11 Radio LAN Standards*, Document IEEE P802.11/91–54, May 1991; pp. 1–20.

Rypinski, *Power–Drain Considerations for Full Time and Sleep Mode Radio Receivers*, IEEE P802.11/91–99, Sep. 1991, 11 pages.

Natarajan et al, *Battery Efficient Operation of Radio MAC Protocol*, IEE P802.11/91–102, Sep. 1991, pp. 1–5.

Cox, *A Radio System Proposal for Widespread Low–Power Tetherless Communications*, IEEE Transactions on Communications, vol. 39, No. 2 (Feb. 1991), pp. 324–335.

Bagby, *One Approach to Wireless Network Architecture*, IEEE P802.11/91–2, Jan. 1991, 1–15, 17–21.

Biba, *A Modest Proposal for a Asynchronous, Data Intensive, Wireless Local Area Network*, IEEE P802.11/91–25, Mar. 1991; pp. 1–25.

Heimschi et al; *Merged CMSO/Bipolar Curent Switch Logic (MCSL)*, IEEE Journal of Solid State Circuits, vol. 24, pp. 1307–1311, Oct. 1989, pp. 1307–1311.

Elrabaa et al; *Optimization of Digital BiCMOS Circuits, An Overview*, IEEE 1992, 5 pages.

Mudd et al, *Very High Speed ECL/CMG Gate Arrays with Submicron Structures;* IEEE 1989, 5 pages.

Atkinson, A Single Chip Radio Transceiver for DECT, IEEE 1997.

Mizuno, A GHzMOS Adaptive Pipeline Technique Using MOS Curren–Mode Logic, IEEE Journal of Solid–State Circuits, vol. 31, No. 6, pp. 784–791 (Jun. 1996).

Klose, Process–Optimization for Sub–3Ops BiCMOS Technologies for Mixed ECL/CMOS Applications, IEEE 1991.

Heimsch, Merged CMOS/Bipolar Current Switch Logic (MCSL), IEEE Journal of Solid–State Circuits, vol. 24, No. 5, pp. 1307–1311 (Oct. 1989).

Elrabaa, Optimization of Digital BiCMOS Circuit, An Overview, IEEE 1992.

Elrabaa, Multimitter BiCMOS CML Circuits, IEEE Journal of Solid–State Circuits, vol. 27, No. 3, pp. 454–458 (Mar. 1992).

Ewen et al., Single–Chip 1062Mbaud CMOS Transceiver for Serial Data Communication, 1995 IEEE International Solid–State Circuits Conference Digest of Technical Papers, pp. 32–33, 336.

Chen and Waldron, A Single–Chip 266Mb/s CMOS Transmitter/Receiver for Serial Data Communications, 1993 IEEE International Solid–State Circuits Conference Digest of Technical Papers, pp. 100–101, 269.

Oshima et al., A Single CMOS SDH Terminal Chip for 622 Mb/s STM 4C, 1994 IEEE International Solid–State Circuits Conference Digest of Technical Papers, pp. 174–175.

Widmer et al., Single–Chip 4×500Mbaud CMOS Transceiver, 1996 IEEE International Solid–State Circuits Conference Digest of Technical Papers, pp. 126–127, 430.

Lee et al., A CMOS Serial Link for 1 Gbaud Fully Duplexed Data Communication, 1994 Symposium on VLSI Circuits Digest of Technical Papers, pp. 125–126.

Lee et al., A CMOS Serial Link for Fully Duplexed Data Communication, IEEE Journal of Solid–State Circuits, vol. 30, pp. 353–364 (Apr. 1995).

Djahanshahi et al., High–speed ECL–Compatible Serial I/0 in 0.35µm CMOS, IEEE 1998.

Fukaishi et al., A 4.25–Gb/s CMOS Fiber Channel Transceiver with Asynchronous Tree–Type Demultiplexer and Frequency Conversion Architecture, IEEE Journal of Solid–state Circuits, vol. 33 No. 12, pp. 2139–2147 (1998).

Madhavan and Levi, Low–Power 2.5 Gbit/s VCSEL driver in 0.5µm CMOS technology, Electronics Letters, vol. 34 No. 2 pp. 178–179 (Jan. 1998).

Chen and Baker, A. 1.25Gb/s, 460mW CMOS Transceiver for Serial Data Communication, 1997 IEEE International Solid–state Circuits Conference pp. 242–243, 465.

Runge and Thomas, 5Gbit/s 2:1 multiplexer fabricated in 0.35µm CMOS and 4Gibt/s 1:2 demultiplexer fabricated in 0.5µm CMOS technology, Electronics Letters, vol. 35 No. 19.pp. 163 1–33 (Sep. 1999).

Fiedler et al., A 1.0625Gbps Transceiver with 2x–Oversampling and Transmit Signal Pre–Emphasis, 1997 IEEE International Solid–state Circuits Conference pp. 238–239, 464.

Widmer et al., Single–Chip 4 x 500–MEd CMOS Transceiver, IEEE Journal of Solid–state Circuits, vol. 31 No. 12 pp. 2004–2014 (1996).

Kurisu et al., 2.8Gb/s 176mW Byte–Interleaved and 3.0 Gb/s 118mW Bit–Interleaved 8:1 Multiplexers, 1996 International Solid state Circuits Conference pp. 122–123, 429.

Friedman et al, A Baseband Processor for IS–54 Cellular Telephony, IEEE Journal of Solid–state Circuits, vol. 31 No. 5 pp. 646–655 (May 1996).

Ewen et al., CMOS circuits for Gb/s serial data communication, IBM J. Res. Develop., vol. 39 No. 12 pp. 73–81 (Mar. 1995).

Thompson et al., A 300–MHz BiCMOS Serial Data Transceiver, IEEE Journal of Solid–state Circuits, vol. 29 No. 3 pp. 185–192 (1994).

Yuen et al., An ECL Gate Array with 2.5 GHz Embedded PLL, IEEE 1993.

Quigley et al., Current Mode Transceiver Logic, (CMTL) for Reduced Swing CMOS, Chip to Chip Communication, IEEE 1993.

Dunlop et al., A 9 Gbit/s Bandwidth MultiplexerfDemultiplexer CMOS Chip, 1992 Symposium on VLSI Circuits Digest of Technical Papers pp. 68–69.

Navarro and Van Noije, Design of an 8:1 MUX at 1.7Gbit/s in 0.8µm CMOS Technology, 1998 Great Lakes Symposium on VLSI.

Pederson and Metz, A CMOS to 100K ECL Interface Circuit, 1989 IEEE International Solid–state Circuits Conference pp. 226–227, 345.

Baumert et al., A Monolithic 50–200 MHz CMOS Clock Recovery and Retiming Circuit, IEEE 1989 Custom Integrated Circuits Conference pp. 14.5.1–14.5.4. (May 1989).

* cited by examiner

LAYOUT TECHNIQUE FOR C3MOS INDUCTIVE BROADBANDING

CROSS-REFERENCES TO RELATED APPLICATIONS

This application is a continuation of U.S. patent application Ser. No. 09/861,143 filed May 17, 2001 now U.S. Pat. No. 6,864,558 which is related to U.S. patent application Ser. No. 09/610,905, filed Jul. 6, 2000, entitled CURRENT-CONTROLLED CMOS CIRCUITS WITH INDUCTIVE BROADBAND, the disclosures of which are hereby incorporated by reference herein.

BACKGROUND OF THE INVENTION

The design of an integrated circuit (IC) requires that a layout be designed which specifies the arrangement of the various circuit components on the major surface of a semiconductor substrate, for example a silicon crystal.

Since many circuit elements are repeatedly utilized, these circuit elements are reduced to cells. The layout can be generated by arranging the cells and connecting them using conductive interconnects. Layout is usually performed utilizing sophisticated software tools well-known to persons of skill in the art.

The layout of the interconnects is a complex geometrical problem. However, in high frequency ICs the layout must also account for electromagnetic effects, which cause parasitic resistance and capacitance which can degrade the performance of the IC.

FIG. 1 depicts the standard design of a cell 10, a layout of two cells, and the interconnection of the cells where each cell 10 includes an inductor region 12, a resistor region 14, and a transistor region 16. An example of such a circuit is disclosed in the aforementioned application.

In FIG. 1 a first set of conductive lines 18 couples the inductor region 12 to the resistor region 14 and a second set of conductive lines 20 connects the resistor region 14 to the transistor region 16. A set of cell to cell signal interconnects 22 couples the output nodes of the first cell to the inputs of the transistor region of the second cell. All the regions 12, 14, and 16 are rectangular and have a characteristic lateral dimension: DI for the inductor region 12, DR for the resistor region 14, and DT for the transistor region. As is apparent from FIG. 1, the lateral dimension of the cell 10 is about equal to the dimension of the largest circuit element, in this case the inductor, and is about equal to DI. Because of the symmetrical design of the inductor, resistor regions, and transistor regions, the regions tend to be aligned and the length of the conductive lines connecting the regions minimized. The length of the cell-to-cell interconnects, which transmit high frequency signals, is thus very long because of the large lateral dimension of the inductor compared to the other regions.

In very high frequency applications, the interconnect parasitic resistors and capacitors form an RC network that plays a very important role. This RC network attenuates the high frequency clock and creates Inter-Symbol Interference (ISI) jitter on the data. These effects become even more important for C3MOS cells with inductive broadbanding. (The presence of the inductors in these cases changes the RC networks to RCL networks). As described above and in the referenced patent, the load here includes an inductor in series with a resistor. Since the physical size of the inductor is typically an order of magnitude bigger than the physical size of the resistor, these cells require a small area for transistors and resistors and a very large area for inductors. As depicted in FIG. 1, this makes the cell-to-cell interconnects 22 very long. Since the length of the interconnects is directly proportional to their parasitic resistance and capacitance, whatever speed improvement is gained through inductive broadbanding can be lost due to these additional parasitic effects if the layout is not done carefully. Moreover, if the inductors are close to metal or active areas, magnetic coupling further degrades the speed improvement.

BRIEF SUMMARY OF THE INVENTION

According to one aspect of the invention, an improved cell layout for a C3MOS circuit with inductive broadbanding effectively isolates the inductor region from metal and active layers and reduces the length of cell-to-cell interconnects.

According to another aspect of the invention, first and second cells have a common boundary. The inductor, resistor, and transistor regions of each cell are aligned near the common boundary to reduce the length of the cell-to-cell interconnect.

According to another aspect of the invention, the length of the conductive lines connecting the inductor region to the resistor region is greater than the length of the conductive lines connecting the resistor region to the transistor region to isolate the inductors from metalizations and active areas.

According to another aspect of the region, the parasitic capacitance of the lines connecting the inductor and resistor regions is less than 20% of the load capacitance, thereby improving circuit performance.

Other features and advantages of the invention will be apparent from the following detailed description and appended drawings.

DESCRIPTION OF THE SPECIFIC EMBODIMENTS

In one embodiment of the invention, the circuit elements are fabricated utilizing ultra-high-speed logic circuitry implemented in silicon complementary metal-oxide-semiconductor (CMOS) process technology. A distinction is made herein between the terminology "CMOS process technology" and "CMOS logic." CMOS process technology as used herein refers generally to a variety of well established CMOS fabrication processes that form a field-effect transistor over a silicon substrate with a gate terminal typically made of polysilicon material disposed on top of an insulating material such as silicon dioxide.

Figure 2:
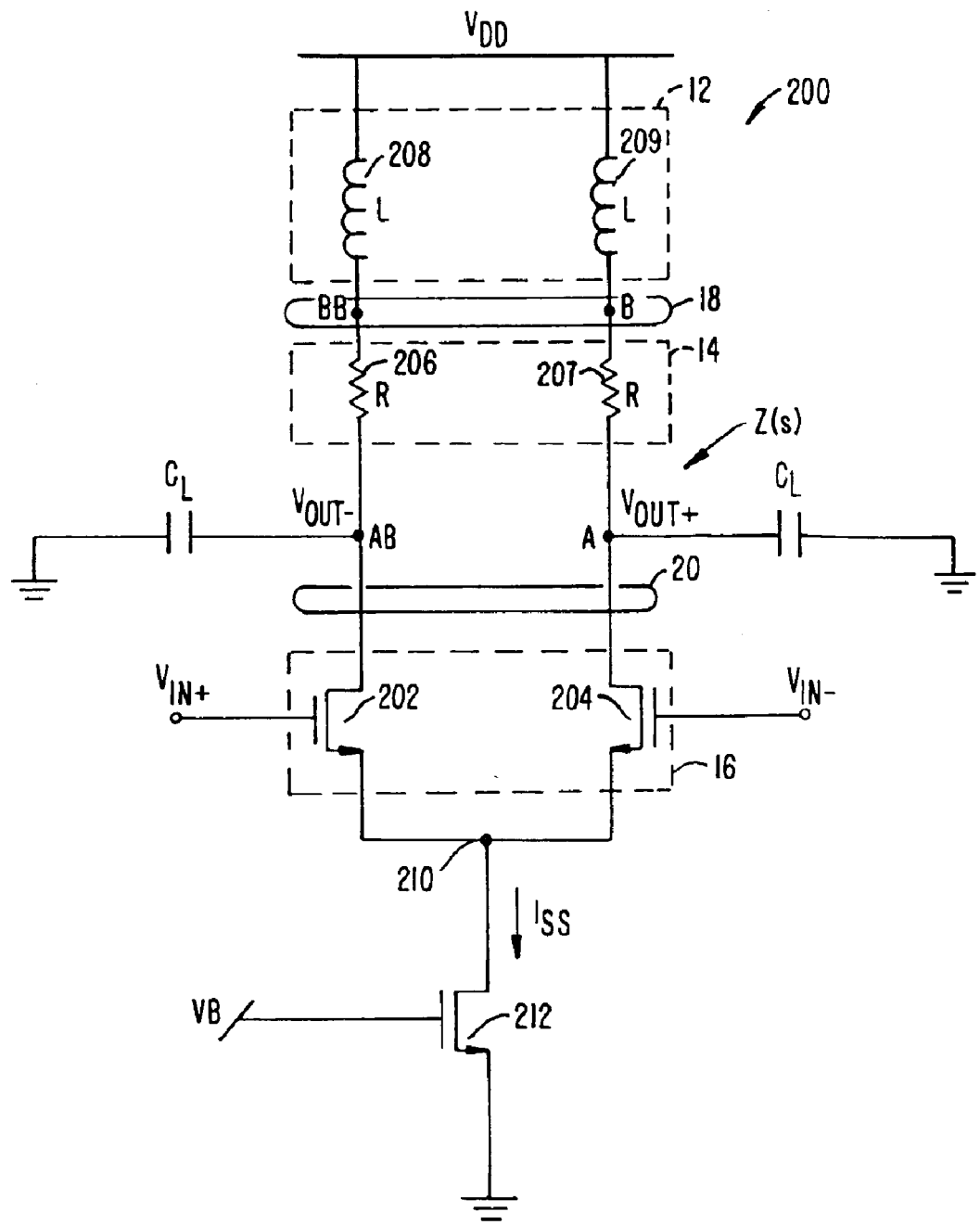
FIG. 2 is a C3MOS buffer circuit with inductive broadbanding.

FIG. 2 depicts a buffer circuit fabricated utilizing, by way of example, not limitation, C3MOS technology which is described in detail in the above-referenced patent application. It is to be understood that the present invention is useful in many contexts and is not limited to particular circuit designs.

FIG. 2 is a schematic diagram of a buffer circuit utilizing inductive broadbanding, illustrates the basic C3MOS buffer 200 with shunt inductors L, and load capacitors $C_L$. A pair of n-channel MOSFETs 202 and 204 receive differential logic signals $V_{in}+$ and $V_{in}-$, at their gate terminals, respectively. Resistive loads 206 and 207 in series with shunt inductors 208 and 209 connect the drain terminals of MOSFETs 202 and 204, respectively, to the power supply VDD. Drain terminals of MOSFETs 202 and 204 form the outputs $V_{out}-$ and $V_{out}+$ of the differential pair, respectively. In a preferred embodiment, the shunt inductors 208 and 209 are spiral inductors coupled to the substrate utilizing standard techniques. Resistive loads 206 and 207 may be made up of either p-channel MOSFETs operating in their linear region, or resistors made up of, for example, polysilicon material. In a preferred embodiment, polysilicon resistors are used to implement resistive loads 206 and 207, which maximizes the speed of buffer 200. The source terminals of n-channel MOSFETs 202 and 204 connect at node 210. A current-source n-channel MOSFET 212 connects node 210 to ground (or negative power supply). A bias voltage VB drives the gate terminal of current-source MOSFET 212 and sets up the amount of current I that flows through buffer 200.

In FIG. 2 a first pair of nodes, A and AB, and a second pair of nodes, B and BB are depicted. The first pair of nodes are coupled to the outputs and are thus sensitive to parasitic series resistance and shunt capacitance. Accordingly, it is desirable to reduce the length of cell-to-cell interconnects coupled to the first pair of nodes as much as possible.

On the other hand, the second pair of nodes are not very sensitive to parasitic resistance and shunt capacitance so that the conductive lines between the resistor region 14 the inductor region 12 can be increased in length to increase the isolation of the inductors from other circuit elements.

Figure 1:
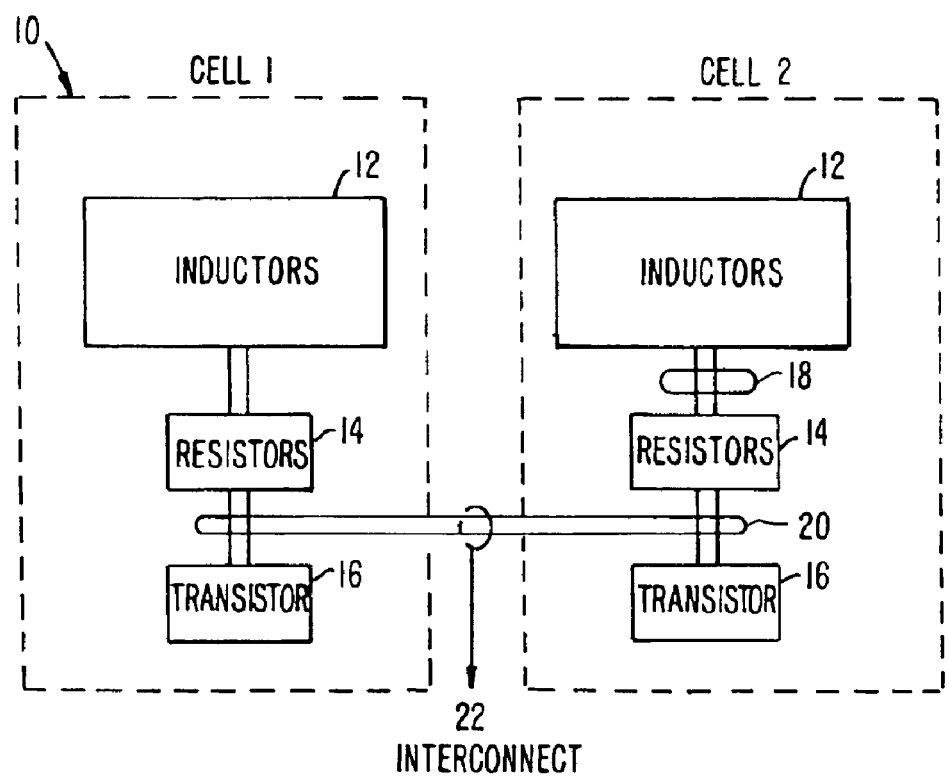
FIG. 1 is a block diagram depicting a standard cell layout.
Figure 3:
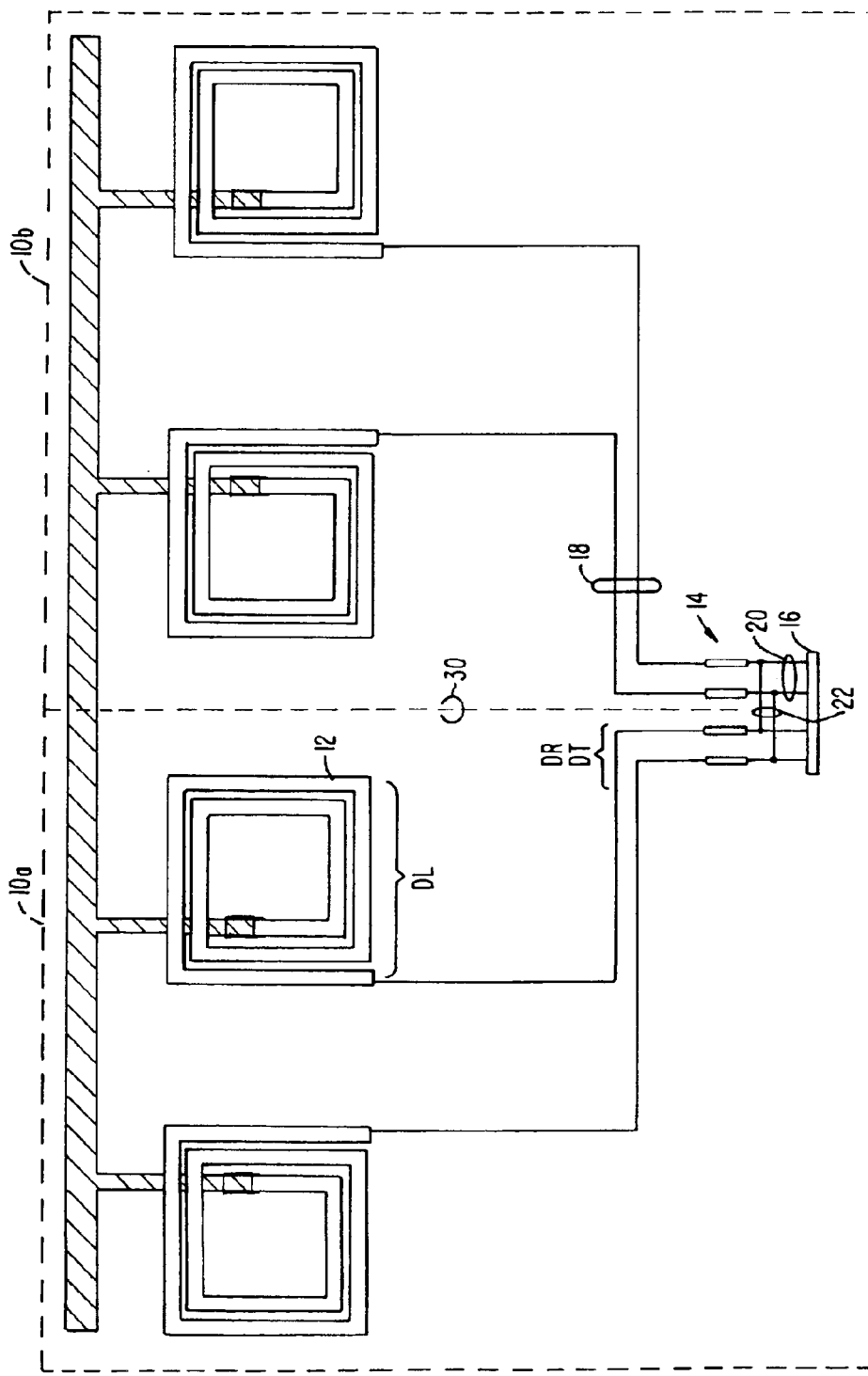
FIG. 3 depicts an embodiment of a layout cell.

FIG. 3 depicts an embodiment of a cell layout with first and second cells 10a and 10b having a common boundary 30. In FIG. 3, referring to the first cell 10a, the inductor region, resistor region, and transistor regions all have their right edges aligned so that the right edge of each region is disposed near the right edge of the cell. Similarly, referring to the second cell 10b, the inductor region, resistor region, and transistor region are all aligned so that the left edge of each region is disposed near the left edge of the cell. Because of this alignment, the signal lines connecting the output nodes of the first cell to the input nodes of the transistor region in the second cell have a reduced length compared to the signal interconnects of the standard cell in FIG. 1. This reduced length reduces the parasitic resistance and capacitance of the signal lines.

Additionally, the length of the second set of conductive lines between the resistor and transistor regions is kept small while the length of the first set of conductive lines between the inductor and resistor regions is increased to increase the isolation of the inductor region from the signal lines. For these first interconnect lines the parasitic resistance is added to the load resistance of the resistor region without degrading the bandwidth of the cell. Thus, the parasitic burden is shifted to the relatively insensitive first set of conductive lines from the highly sensitive signal interconnects.

Further, the inventors have discovered that overall performance can be improved over the case where there is no parasitic capacitance This can be explained as follows. The basis of the inductive shunt-peaking technique is to add a pair of inductors to the circuit so that the circuit's natural frequencies are changed in such a way that the circuit's transient response becomes faster. When a moderate parasitic capacitance (less than 20% of the load capacitance) is added to the first set of conductive lines, the circuit's natural frequencies change in a similar way, such that the circuit's transient response is further improved. The improvement ceases, however, if the parasitic capacitance becomes larger than 20% of the load capacitance.

The invention has now been described with reference to the preferred embodiments. Alternatives and substitutions will now be apparent to persons of skill in the art. For example, other fabrication technologies can be utilized instead of CMOS processing technology. Further, although a C3MOS buffer has been used as an exemplary embodiment, the principles of the invention are extendable to other circuits such as flip-flops, latches, etc. that include an inductor in series with a resistor. Accordingly, it is not intended to limit the invention except as provided by the appended claims.

What is claimed is:

1. A circuit layout implemented with a semiconductor substrate comprising:
   at least one spiral inductor comprising a first edge defined on the semiconductor substrate;
   at least one resistor comprising a second edge defined on the semiconductor substrate; and
   at least one transistor comprising a third edge defined on the semiconductor substrate;
   wherein the first edge, the second edge and the third edge are substantially aligned.

2. The circuit layout of claim 1 wherein the first edge, the second edge and the third edge are substantially aligned with a boundary of a cell defined on the semiconductor substrate.

3. The circuit layout of claim 1 wherein:
   the at least one spiral inductor is characterized by a first lateral dimension;
   the at least one resistor is characterized by a second lateral dimension;
   the at least one transistor is characterized by a third lateral dimension;
   the second lateral dimension is substantially smaller than the first lateral dimension; and
   the third lateral dimension is substantially smaller than the first lateral dimension.

4. The circuit layout of claim 3 comprising:
   at least one first signal line adapted to couple the at least one spiral inductor with the at least one resistor, wherein the at least one first signal line is characterized by a first length; and
   at least one second signal line adapted to couple the at least one transistor with the at least one resistor, wherein the at least one second signal line is characterized by a second length and wherein the second length is substantially smaller than the first length.

5. The circuit layout of claim 4 wherein the at least one spiral inductor and the at least one second signal line are positioned on the substrate to isolate the at least one spiral inductor from the at least one second signal line.

6. The circuit layout of claim 4 wherein parasitic capacitance of the at least one first signal line is less than about 20% of a load capacitance associated with the circuit layout.

7. The circuit layout of claim 1 wherein the at least one resistor comprises at least one MOSFET.

8. The circuit layout of claim 1 wherein the at least one resistor comprises at least one polysilicon resistor.

9. The circuit layout of claim 1 wherein the at least one transistor comprises at least one MOSFET.

10. The circuit layout of claim 1 wherein the at least one spiral inductor is coupled to the substrate.

11. A circuit layout disposed on a semiconductor substrate comprising:
    a first layout cell comprising:
    a first boundary;

a first spiral inductor region comprising a first edge;
a first resistor region comprising a second edge;
a first transistor region comprising a third edge;
wherein the first edge, the second edge and the third edge are aligned substantially adjacent to the first boundary of the first layout cell; and a second layout cell comprising:
a second boundary that is substantially common with the first boundary of the first layout cell;
a second spiral inductor region comprising a fourth edge;
a second resistor region comprising a fifth edge;
a second transistor region comprising a sixth edge;
wherein the fourth edge, the fifth edge and the sixth edge are aligned substantially adjacent to the second boundary of the second layout cell.

12. The circuit layout of claim 11 wherein
the first spiral inductor region is characterized by a first lateral dimension;
the first resistor region is characterized by a second lateral dimension;
the first transistor region is characterized by a third lateral dimension;
the second spiral inductor region is characterized by the first lateral dimension;
the second resistor region is characterized by the second lateral dimension;
the second transistor region is characterized by the third lateral dimension.

13. The circuit layout of claim 12 wherein:
the first layout cell comprises:
a first set of conductive lines coupling the first spiral inductor region with the first resistor region; and
a second set of conductive lines coupling the first resistor region with the first transistor region, wherein a length characterizing the first set of conductive lines is substantially larger than a length characterizing the second set of conductive lines to isolate the first spiral inductor region from the first transistor region; and the second layout cell comprises:
a third set of conductive lines coupling the second spiral inductor region with the second resistor region; and
a fourth set of conductive lines coupling the second resistor region with the second transistor region, wherein a length characterizing the third set of conductive lines is substantially larger than a length characterizing the fourth set of conductive lines to isolate the second spiral inductor region from the second transistor region.

14. The circuit layout of claim 13 comprising:
signal interconnect lines coupling the second set of conductive lines in the first layout cell with the second transistor region in the second layout cell;
wherein the alignments of the first edge, the second edge, the third edge, the fourth edge, the fifth edge and the sixth edge facilitate shortening the signal interconnect lines.

15. The circuit layout of claim 13 further comprising:
a load capacitance region coupled to the first set of conductive lines;
wherein the length characterizing the first set of conductive lines results in a parasitic capacitance of less than about 20% of the capacitance of the load capacitance region.

16. The circuit layout of claim 11 wherein:
the first layout cell comprises:
a first set of conductive lines coupling the first spiral inductor region with the first resistor region; and
a second set of conductive lines coupling the first resistor region with the first transistor region, wherein a length characterizing the first set of conductive lines is substantially larger than a length characterizing the second set of conductive lines to isolate the first spiral inductor region from the first transistor region; and the second layout cell comprises:
a third set of conductive lines coupling the second spiral inductor region with the second resistor region; and
a fourth set of conductive lines coupling the second resistor region with the second transistor region, wherein a length characterizing the third set of conductive lines is substantially larger than a length characterizing the fourth set of conductive lines to isolate the second spiral inductor region from the second transistor region.

17. The circuit layout of claim 16 comprising:
signal interconnect lines coupling the second set of conductive lines in the first layout cell with the second translator region in the second layout cell;
wherein the alignments of the first edge, the second edge, the third edge, the fourth edge, the fifth edge and the sixth edge facilitate shortening the signal interconnect lines.

18. The circuit layout of claim 16 further comprising:
a load capacitance region coupled to the first set of conductive lines;
wherein the length characterizing the first set of conductive lines results in a parasitic capacitance of less than about 20% of the capacitance of the load capacitance region.

* * * * *

UNITED STATES PATENT AND TRADEMARK OFFICE
CERTIFICATE OF CORRECTION

PATENT NO. : 7,132,727 B2 Page 1 of 1
APPLICATION NO. : 10/847832
DATED : November 7, 2006
INVENTOR(S) : Afshin Momtaz et al.

It is certified that error appears in the above-identified patent and that said Letters Patent is hereby corrected as shown below:

Column 4, line 18, in Claim 1: after "substrate;" remove "and"

Column 4, line 20, in Claim 1: after "substrate;" insert --and--

Column 5, line 14, in Claim 11: after "edge;" insert --and--

Column 5, line 18, in Claim 12: after "wherein" insert --:--

Column 5, line 30, in Claim 12: after "dimension;" insert --and--

Column 6, line 4, in Claim 14: after "cell;" insert --and--

Column 6, line 11, in Claim 15: after "lines;" insert --and--

Column 6, line 41, in Claim 17: after "cell;" insert --and--

Column 6, line 49, in Claim 18: after "lines;" inset --and--

Signed and Sealed this

Fifteenth Day of July, 2008

JON W. DUDAS
*Director of the United States Patent and Trademark Office*